(12) United States Patent
Wu et al.

(10) Patent No.: US 6,815,505 B2
(45) Date of Patent: Nov. 9, 2004

(54) ELECTROACTIVE POLYMERS AND DEVICES MADE THEREFROM

(75) Inventors: Weishi Wu, Midland, MI (US); Michael Inbasekaran, Midland, MI (US); Mark T. Bernius, Midland, MI (US); James J. O'Brien, Midland, MI (US)

(73) Assignee: Dow Global Technologies Inc., Midland, MI (US)

( * ) Notice: Subject to any disclaimer, the term of this patent is extended or adjusted under 35 U.S.C. 154(b) by 0 days.

(21) Appl. No.: 10/193,410

(22) Filed: Jul. 10, 2002

(65) Prior Publication Data

US 2003/0045642 A1 Mar. 6, 2003

Related U.S. Application Data

(60) Provisional application No. 60/304,336, filed on Jul. 10, 2001.

(51) Int. Cl.$^7$ .......................... C08L 39/04; C08L 37/00; C08L 41/00
(52) U.S. Cl. ...................... 525/204; 525/206; 525/280; 525/284; 528/373; 528/423; 528/424
(58) Field of Search ................................. 525/204, 206, 525/280, 284; 528/373, 423, 424

(56) References Cited

U.S. PATENT DOCUMENTS

| | | | |
|---|---|---|---|
| 5,621,131 A | 4/1997 | Kreuder et al. | 558/46 |
| 5,708,130 A | 1/1998 | Woo et al. | 528/397 |
| 5,777,070 A | 7/1998 | Inbasekaran et al. | 528/394 |
| 5,998,045 A | 12/1999 | Chen et al. | 428/690 |
| 6,169,163 B1 | 1/2001 | Woo et al. | 528/397 |
| 6,204,515 B1 | 3/2001 | Bernius et al. | 257/40 |
| 6,512,070 B2 | 1/2003 | Hawker et al. | 526/347.1 |
| 6,541,602 B1 | 4/2003 | Spreitzer et al. | 528/394 |
| 2001/0024738 A1 | 9/2001 | Hawker et al. | 428/690 |

FOREIGN PATENT DOCUMENTS

| | | | | |
|---|---|---|---|---|
| WO | WO 99/48160 | 9/1999 | | H01L/51/20 |
| WO | WO 99/54385 | 10/1999 | | C08G/73/02 |
| WO | WO 00/46321 | 8/2000 | | C09K/11/06 |
| WO | WO 00/55927 | 9/2000 | | H01L/51/20 |
| WO | WO 01/81294 | 11/2001 | | C07C/211/55 |

OTHER PUBLICATIONS

Burroughes, et al., "Light–emitting diodes based on conjugated polymers" *Nature*, vol. 347, pp. 539–541 (Oct. 1990).
Chen, et al., "Improved efficiencies of light–emitting diodes through incorporation of charge transporting components in tri–block polymers", *Syn. Met.*, vol. 107, pp. 203–207 (1999).
Fukuda, "Synthesis of usible and Soluble Conducting Polyfluorene Derivatives and Their Characteristics" *J. of Poly. Sci.*, vol. 31, pp. 2465–2471 (1993).
Heischkel, et al., "Synthesis of ABC–triblock copolymers for light emitting diodes" *Macromol. Chem. Phys.*, vol. 199, pp. 869–880.
Kim, et al., "LED Characterization of and Alternating Copolymer and its Blends" *SPIE* vol. 3148, pp. 151–158.
Tasch, et al., "Efficient red– and orange–light–emitting diodes realized by excitation energy transfer from blue–light–emitting conjugated polymers" *Physical Review B, The American Physical Society*, vol. 56, No 8 (1997) pp. 4479–4483.
Woo, et al., "Highly Efficient LEDs based on Fluorene Polmers," *MRS Meeting*, Apr. 1998.
Yu, et al., "Enhanced electroluminescence from semiconducting polymer blends", *Syn. Met*.vol. 72 (1995) pp. 249–252.

Primary Examiner—Duc Truong
(74) Attorney, Agent, or Firm—Susan Moeller Zerull

(57) ABSTRACT

An organic block polymer useful in an electroluminescent polymer device (or in a polymer field effect transistor) that includes an emissive polymer block that is consistently conjugated along the backbone of the emissive polymer block (e.g., a copolymer of 2,7-linked 9,9 dioctyl fluorene and 4,7-linked 2,1,3 benxothiadiazole); and a positive charge carrier polymer block that is consistently conjugated along the backbone of the positive charge carrier polymer block (e.g., a copolymer of 2,7-linked 9,9 dioctyl fluorene and 4N, 4N'-linked N,N'-di(3-carboxomethoxyphenyl) benzidine) for transporting positive charge carriers to the emissive polymer block so that the positive charge carriers can combine with negative charge carriers to generate light.

33 Claims, No Drawings

ELECTROACTIVE POLYMERS AND DEVICES MADE THEREFROM

CROSS REFERENCE STATEMENT

This application claims the benefit of U.S. Provisional Application No. 60/304,336, filed Jul. 10, 2001.

GOVERNMENT CONTRACT

This invention was made with government support under Contract Number N00421-98C-1187. The government has certain rights in the invention.

FIELD OF THE INVENTION

The instant invention relates to electroactive polymers, particularly electroluminescent polymers, that are block polymers, and to processes for making such block polymers.

BACKGROUND OF THE INVENTION

Highly conjugated polymeric materials have been taught to be useful as semiconductors. See e.g. U.S. Pat. No. 6,204,515. Burroughes et al. discovered that certain conjugated polymeric materials, specifically polyphenylene vinylene (PPV), were electroluminescent and thus could be used in light emitting diodes. Burroughes et al., "Light-emitting diodes ased on conjugated polymers" Nature, vol. 347, pp. 539–541, October 1990.

Extensive work has occurred since this initial discovery. This work includes use of variations of PPV as well as other types of conjugated polymers—e.g. polythiophenes, polyfluorenes. See e.g. Fukuda, "Synthesis of Fusible and Sluble Conduscting polyfluorene Derivatives and their Characteristics" J. of Poly. Sci., vol. 31, pp. 2465–2471, 1993, and U.S. Pat. No. 5,708,130. Polymers containing more than one type of monomer unit have also been taught. See e.g. WO 00/46321. Finally, blends of conjugated polymers have been taught to be especially effective as they may allow adjustment of the overall composition to maximize various desired properties, such as emission wavelength, efficiency, lifetime, etc. Yu et al., "Enhanced electroluminescnence from semiconducting polymer blends", Syn . Met. 72 (1995) pp. 249–252; Kim et al., "LED Characterization of an Alternating Copolymer and its Blends" SPIE vol. 3148, pp. 151–158; Tasch et al., "Efficient red- and orange-light emitting diodes realized by excitation energy transfer from blue-light-emitting conjugated polymers" Physical Review B, The American Physical Society, vol. 56, no. 8 (1997) pp. 4479–4483; and U.S. Pat. No. 6,169,163.

While some work has been done using block copolymers, these block copolymers have included blocks that are not consistently conjugated along the backbone of the polymer (because at least part of the backbone of the polymer is saturated). See e.g. Heischkel et al. "Synthesis of ABC-triblock copolymers for light emitting diodes" Macromol. Chem. Phys., 199, 869–880 (1998) and Chen et al., "Improved efficiencies of light-emitting diodes through incorporation of charge transporting components in tri-block polymers", Syn. Met. 107 (1999) pp. 203–207 and U.S. Patent publication 2001/0024738A1.

Electroluminescent polymer devices can be made as layered systems. For example, a transparent layer of electrically conductive indium-tin oxide can be deposited on a pane of glass as the anode of the device. Then a "hole injection" layer of, for example, polyethylene dioxythiophene, (available under the tradename Baytron P from Bayer Corp.) can be formed on the anode. Then a layer of electroluminescent polymer can be formed on top of the hole injection layer. Then, a layer of an appropriate low work function metal, such as calcium, can be formed on top of the electroluminescent polymer layer as the cathode of the device. When an electrical potential is applied between the cathode and anode, holes or positive charge carriers are injected into the electroluminescent polymer layer from the hole injection layer while electrons or negative charge carriers are injected into the electroluminescent polymer layer from the cathode. The negative charge carriers can combine with the positive charge carriers in the electroluminescent polymer layer to generate light.

As disclosed in U.S. Pat. No. 6,204,515, herin fully incorporated by reference, semiconducting polymer field effect transistors can be prepared by forming a layer of an electrically insulating material on an electrically conducting gate layer. A layer of semiconducting polymer is formed on the layer of electrically insulating material, the layer of semiconducting polymer being in electrical contact with and between the source and drain of the transistor.

Towns et al., WO 00/55927, herein fully incorporated by reference, taught a co-polymer for use in an electroluminescent device comprised of at least two or more regions along the length of the polymer backbone. The first region is for transporting negative charge carriers. The second region is for transporting positive charge carrier. The third region is for accepting and combining the positive and negative charge carriers to generate light. While mentioning at page 4, second paragraph that the components could be combined in the main chain, side chains, in block or random copolymer form, Towns teaches only how to make random copolymers and exemplifies only random coopolymers and only polymers of two different monomers, See Example 5. Towns also indicates that the third component may be present as part of the copolymer or as a separate blended component and in Example 6 blends the random copolymer of Example 5 with another copolymer.

The various optimized polymers and polymer blends of Towns et al. are an advance in the art because they tend to optimize the energy levels and bandgap of the polymers and polymer blends. However, it would be a further advance in the art of electroluminescent polymers if the brightness, energy efficiency and lifetime of electroluminescent devices made from electroluminescent polymers could be further improved.

SUMMARY OF THE INVENTION

Applicants have found that certain specifically designed block polymers surprisingly function better in electroluminescent devices (better brightness, energy efficiency and lifetime) than: (a) random polymers of the same monomers; or (b) blends of random polymers of the same monomers.

More specifically, the instant invention is an organic block polymer useful in an electroluminescent polymer device, comprising: (a) an emissive polymer block that is consistently conjugated along the backbone of the emissive polymer block (e.g., a copolymer of 2,7-linked 9,9 dioctyl fluorene and 4,7-linked 2,1,3-benzothiadiazole); and at least one of the following: (b) a positive charge carrier polymer block that is consistently conjugated along the backbone of the positive charge carrier polymer block (e.g., a copolymer of 2,7-linked 9,9-dioctylfluorene and 4,4'-linked N,N'-di(3-carbomethoxyphenyl)benzidine) for transporting positive charge carriers to the emissive polymer block so that the positive charge carriers can combine with negative charge carriers to generate light, (c) a negative charge carrier polymer block that is consistently conjugated along the backbone of the negative charge carrier polymer block for transporting negative charge carriers to the emissive polymer block so that the negative charge carriers can combine with positive charge carriers to generate light, and (d) a host polymer block that is consistently conjugated along the backbone of the host block for providing a matrix for emitter that affords Forster energy transfer and minimization of concentration quenching effects.

In another embodiment the instant invention is an improved electroluminescent polymer device that includes an anode, a cathode and an electroluminescent polymer positioned between the anode and the cathode, wherein the improvement comprises: the electroluminescent polymer being an organic block polymer comprising an emissive polymer block that is consistently conjugated along the backbone of the emissive polymer block and a positive charge carrier polymer block that is consistently conjugated along the backbone of the positive charge carrier polymer block.

In yet another embodiment, the instant invention is an improved semiconducting polymer field effect transistor that includes a semiconducting polymer positioned between and in electrical contact with a drain and a source, wherein the improvement comprises: the semiconducting polymer being an organic block polymer comprising an emissive polymer block that is consistently conjugated along the backbone of the emissive polymer block and a positive charge carrier polymer block that is consistently conjugated along the backbone of the positive charge carrier polymer block.

In yet another embodiment, this invention is a method of making the above copolymers by synthesizing the blocks sequentially in time or by separately synthesizing the blocks followed by combination and reaction of the blocks.

DETAILED DESCRIPTION OF THE INVENTION

In its broadest scope, the instant invention is a organic block polymer useful in an electroluminescent polymer device, comprising: (a) an emissive polymer block that is consistently conjugated along the backbone of the emissive polymer block for facilitating the recombination of the charge carriers forming the excited singlet state (exciton) and the subsequent relaxation of the excitons to the ground state with emission of light; and (b) a positive charge carrier polymer block that is consistently conjugated along the backbone of the positive charge carrier polymer block for transporting positive charge carriers to the emissive polymer block so that the positive charge carriers can combine with negative charge carriers to generate light. The term "block polymer" means a polymer whose backbone is made up of at least one section or block of one chemical composition connected to at least another section or block of a different chemical composition. Each such section or block can be comprised of one or more monomer groups. The term "consistently conjugated" means that there is essentially no monomer group in the backbone of the block that does not contain conjugated double bonds.

A "block polymer" is also defined herein by the process used to make it. The blocks of a block polymer are polymerized at different times or in different locations at the same time or at different times. In contrast, a random polymer, comprised of one or more monomer groups, is generally polymerized at one time and in one location.

The emissive polymer block of the instant invention comprises at least a first monomer group selected from those monomer groups known in the art for this function (see, for example WO00/55927, PCT/GB99/00741, U.S. Pat. Nos. 5,777,070, 6,169,163, 5,962,631 and 5,708,130 each of which are fully incorporated herein) and includes substituted or unsubstituted aromatic or heteroaromatic groups, and more particularly polyarylene vinylenes, thiophenes and fluorenes, used alone or in combination. Particularly preferred are fluorene monomer groups and alternating or random copolymers of fluorene, such as a 2,7-linked dialkyl fluorene (e.g., 9,9-dioctyl fluorene or 9,9-dihexyl fluorene) with a second substituted or unsubstituted aromatic or hereroaromatic monomer group such as a polycyclic aromatic group (e.g., naphthalene or anthrecene) or an aromatic or heteroaromatic diazine group fused to a benzene or thiophene group (e.g., a 2,7-linked 2,1,3-benzothiadiazole). When selecting such particularly preferred emissive blocks, the weight ratio of the first to the second monomer should be at least 1:99, more preferably at least 3:97, more preferably still at least 5:95, and most preferably at least 15:85. However, when selecting such particularly preferred emissive blocks, the weight ratio of the first to the second monomer should be no more than 50:50, more preferably no more than 40:60, and most preferably no more than 30:70. The mole ratio for the the first to second monomers is preferably at least 10:90, more preferably at least 20:80. The mole ratio for the first to second monomer is preferably less than 90:10, more preferably less than 80:20. In many instances, alternating copolymers function well as the emissive block.

The positive charge carrier polymer block of the instant invention comprises a third monomer selected from those monomer groups known in the art for this function (see, for example PCT/GB00/00911, PCT/GB99/00741, U.S. Pat. Nos. 5,777,070, 6,169,163, 5,962,631 and 5,708,130) and includes substituted or unsubstituted aromatic or heteroaromatic groups, and more particularly polyarylene vinylenes, thiophenes and fluorenes, used alone or in combination. Particularly preferred are fluorene monomer groups and alternating or random copolymers of fluorene, such as a 2,7-linked dialkyl fluorene (e.g., 9,9 dioctyl fluorene or 9,9 dihexyl fluorene) with a substituted or unsubstituted aromatic or heteroaromatic fourth monomer such as a 1,4-diene without electron-withdrawing substitutents, tertiary amines, N,N,N',N'-tetraaryl-1,4-diaminobenzene, N,N,N',N'-tetraarylbenzidine, N-substituted-carbazoles, diarylsilanes, and thiophenes/furans/pyrroles without electron-withdrawing substitutents. It may be desirable to substitute the third monomer group with a substituant selected from the group consisting of $C_{1-20}$ alkyls, $C_{6-20}$ aryls and alkylaryls optionally substituted with $C_{1-6}$ alkoxys and $C_{6-12}$ aryloxys. A preferred fourth monomer comprises a triarylamine group having the general formula —Ar$_3$N— wherein each Ar is the same or different and comprises a substituted or unsubstituted aromatic or heteroaromatic group. A preferred fourth monomer group is N,N'-di(3-carboxomethoxyphenyl)benzidine. Another preferred fourth monomer group is N,N'-di(4-methoxyphenyl) 1,4-phenylenediamine. When selecting such particularly preferred positive charge carrier blocks, the weight ratio of the third to the fourth monomer should be at least 5:95, more preferably at least 10:90, and most preferably at least 15:85. However, when selecting such particularly preferred positive charge carrier blocks, the weight ratio of the third to the fourth monomer should be no more than 50:50, more preferably no more than 40:60, and most preferably no more than 20:80. The mole ratio for the the third to fourth monomers is preferably at least 10:90, more preferably at least 20:80. The mole ratio for the third to fourth monomer is preferably less than 90:10, more preferably less than 80:20. In many instances, alternating copolymers function well as the positive charge carrier block.

In another embodiment of the instant invention the organic block polymer discussed above can further comprise a wide band gap host polymer block that is consistently conjugated along the backbone of the host polymer block. The host polymer block may perform one or more of the following functions: enable utilization of Forster energy transfer to the narrow band gap emissive polymer block, facilitate transport of charge carriers (electrons or holes), inhibit or limit concentration quenching (also known as dipole-dipole induced light quenching), facilitate charge injection from the adjacent layers (e.g. anode, cathode, hole transport layer, etc.), facilitate attaining a balance of holes and electrons, facilitate morphology control (e.g. glass transition temperature, Tg; phase separation, etc.), and enhance color tuning. The host polymer block of the instant invention comprises a fifth monomer selected from those monomer groups known in the art for this function (see, for example PCT/GB00/00911, PCT/GB99/00741, U.S. Pat. Nos. 5,777,070, 6,169,163, 5,962,631 and 5,708,130) and includes substituted or unsubstituted aromatic or heteroaromatic groups, and more particularly polyarylene vinylenes, thiophenes and fluorenes, used alone or in combination. Particularly preferred are fluorene monomer groups and alternating or random copolymers of fluorene, such as a 2,7-linked dialkyl fluorene (e.g., 9,9 dioctyl fluorene or 9,9 dihexyl fluorene) with a substituted or unsubstituted aromatic or heteroaromatic sixth monomer such as (when positive charge carrier properties are desired) a stilbene or 1,4-diene without electron-withdrawing substitutents, tertiary amines, N,N,N',N'-tetraaryl-1,4-diaminobenzene, N,N,N',N'-tetraarylbenzidine, N-substituted-carbazoles, diarylsilanes, and thiophenes/furans/pyrroles without electron-withdrawing substitutents. It may be desirable to substitute the sixth monomer group with a substituant selected from the group consisting of $C_{1-20}$ alkyls, $C_{6-20}$ aryls and alkylaryls optionally substituted with $C_{1-6}$ alkoxys and $C_{6-12}$ aryloxys. A preferred sixth monomer comprises a triarylamine group having the general formula —Ar$_3$N— wherein each Ar is the same or different and comprises a substituted or unsubstituted aromatic or heteroaromatic group. A preferred sixth monomer group is N,N'-di(3-carboxomethoxyphenyl)benzidine. Another preferred sixth monomer group N,N'-di(4-methoxyphenyl)1,4-phenylenediamine. When selecting such particularly preferred host blocks, the weight ratio of the fifth to the sixth monomer should be at least 5:95, more preferably at least 10:90, and most preferably at least 15:85. However, when selecting such particularly preferred host blocks, the weight ratio of the fifth to the sixth monomer should be no more than 50:50, more preferably no more than 40:60, and most preferably no more than 20:80. The mole ratio for the the fifth to sixth monomers is preferably at least 10:90, more preferably at least 20:80. The mole ratio for the fifth to sixth monomer is preferably less than 90:10, more preferably less than 80:20.

When negative charge carrier properties are desired, the host polymer block may instead have a sixth monomer with an electron withdrawing group or a negative charge carrying block comprising an electron withdrawing group may be used. Such electron withdrawing group can be selected from the group consisting of F, cyano, sulfonyl, carboxy; moieties containing an imine linkage, condensed polycyclic aromatics such as acenaphthene, phenanthrene, anthracene, fluoranthene, pyrene, perylene, rubrene, chrysene, and corene as well as five-membered heterocylces containing imine linkages include oxazoles/isoxazoles, N-substituted-imidazoles/pyrazoles, thiazole/isothiazole, oxadiazoles, and N-substituted-triazoles and six-membered heterocycles containing imine linkages such as pyridines, pyridazines, pyrimidines, pyrazines, triazines, and tetrazenes as well as benzo-fused heterocycles containing imine linkages include benzoxazoles, benzothiazole, benzimidazoles, quinoline, isoquinolines, cinnolines, quinazolines, quinoxalines, phthalazines, benzothiadiazoles, benzotriazines, phenazines, phenanthridines, and, acridines.

Preferably, the monomer groups of the emissive block polymer of the instant invention are essentially not comprised of a stilbene or 1,4-diene without electron-withdrawing substitutents, tertiary amines, N,N,N',N'-tetraaryl-1,4-diaminobenzene, N,N,N',N'-tetraarylbenzidine, N-substituted-carbazoles, diarylsilanes, and thiophenes/furans/pyrroles without electron-withdrawing substitutents. Preferably, the monomer groups of the emissive polymer block are essentially not comprised of a triarylamine group having the general formula —Ar$_3$N— wherein each Ar is the same or different and comprises a substituted or unsubstituted aromatic or heteroaromatic group such as N,N'-di(3-carboxomethoxyphenyl)benzidine or N,N'-di(4-methoxyphenyl) 1,4-phenylenediamine. When selecting such particularly preferred negative charge carrier blocks, the weight ratio of the fifth to the sixth monomer should be at least 5:95, more preferably at least 10:90, and most preferably at least 15:85. However, when selecting such particularly preferred host blocks, the weight ratio of the fifth to the sixth monomer should be no more than 50:50, more preferably no more than 40:60, and most preferably no more than 20:80. The mole ratio for the the fifth to sixth monomers is preferably at least 10:90, more preferably at least 20:80. The mole ratio for the fifth to sixth monomer is preferably less than 90:10, more preferably less than 80:20. The mole ratio for the the first to second monomers is preferably at least 10:90, more preferably at least 20:80. The mole ratio for the first to second monomer is preferably less than 90:10, more preferably less than 80:20.

The weight ratio of the emissive block to the positive charge carrier block is preferably at least 5:95, more preferably at least 10:90 and most preferably at least 15:85. On the other hand, the weight ratio of the emissive block to the positive charge carrier block is preferably no more than 90:10, more preferably no more than 80:20 and most preferably no more than 70:30. The weight ratio of any host block used in the instant invention to the total weight of the block polymer is preferably at least 5:95, more preferably at least 10:90 and most preferably at least 15:85. On the other hand, the weight ratio of such host block to the total weight of the block polymer is preferably no more than 90:10, more preferably no more than 80:20 and most preferably no more than 70:30.

The host block, when used, preferably comprises at least 10, more preferably at least 30, and most preferably at least 40 mole % of the monomeric units in the copolymer. The host polymer preferably comprises less than 99, more preferably less than 90, more preferably still less than 80, and most preferably less than 70 mole % of the monomeric units of the block copolymer. Additional blocks, preferably comprise cumulatively not more than 89, more preferably not more than 50, most preferably not more than 30 mole % of the total moles of monomeric units in the copolymer.

The organic block polymers of the instant invention may be made by modifying any preparative method that is suitable for aromatic coupling polymerizations. Suzuki polymerization disclosed for example in U.S. Pat. No. 5,777,070 is a preferred method for forming the block segments and block polymers of the instant invention. In this method, dibromo functionalized monomers are reacted with diboronate functional monomers in the presence of a base, a phase transfer catalyst, and a catalytic amount of a palladium complex. The blocks may be assembled either by first forming one block, then adding the monomers for the second block to the reaction mixture, followed by sequential addition of monomers for additional blocks if desired. Alternatively, each block may first be assembled separately and then reacted with other blocks prepared in the same manner to form the desired block polymer with two or more distinct block regions. In either of these processes, the averaged block length may be tuned by control of monomer stoichiometry, base addition, or acid addition.

The organic block polymers of the instant invention can be used in a polymeric light emitting diode, as the photoconverter in a photodiode or as the semiconductor in a polymer field effect transistor.

EXAMPLE 1

(Diblock Blue Emitter)

To a stirred solution of 2,7-dibromo-9,9-dihexylfluorene (3.18 g, 6.46 mmol), 9,10-dibromoanthracene (114 mg, 0.34 mmol), and 9,9-dihexylfluorene-2,7-bisboronate (3.32 g, 7 mmol) in 60 mL of toluene under nitrogen is added Aliquat 336 (phase transfer catalyst, registered trademark of Henkel Corporation) (1.5 g), tetrakis(triphenylphosphine)palladium (8.6 mg) and 2M sodium carbonate (20 mL). After refluxing and stirring for 24 hours, another 50 mL of toluene was added and heated another 3 hours to obtain AN5 emitting block as a clear solution in toluene. The following formula is for the AN5 emitting block.

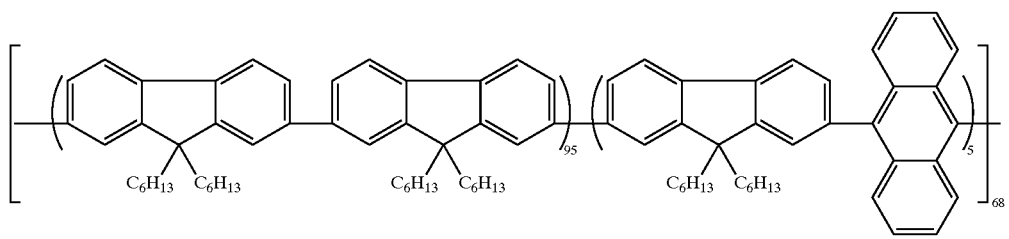

To the above solution was added compound of the formula

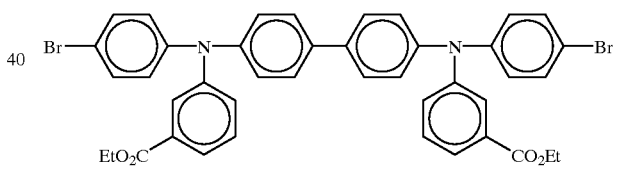

(at 1.162 g, 1.47 mmol), and compound of the formula

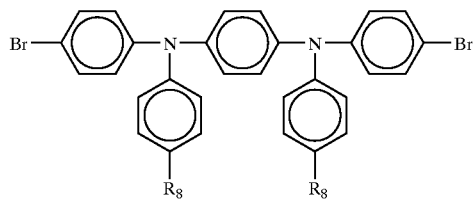

R$_8$ = methoxy (at 1.091 g, 1.73 mmol) and 9,9-dihexylfluorene-2,7-bisboronate (1.518 g) along with Aliquat 336 (phase transfer catalyst) (0.6 g) and tetrakis(triphenylphosphine)palladium (8 mg) and the reaction continued for 13 hours. Di-bromo BFE has the formula:

The diblock polymer was end capped with 0.5 g of phenylboronic acid for 8 hours of refluxing and isolated as pale yellow fibers (6 g) by precipitating from 2L of methanol. Further purification and additional precipitation led to pure polymer which weighed 5.74 g and had an inherent viscosity of 2.04 dL/g (THF, 25° C., 0.5 g/dL). The following formula is for the positive charge carrier block.

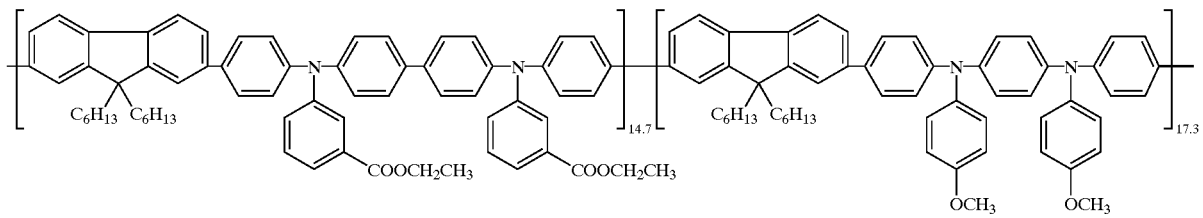

The above-described block polymer is used in a standardized polymer light emitting diode device prepared by depositing a layer of Baytron P polyethylene dioxythiophene on an indium-tin oxide coated pane of glass, followed by a layer of the block polymer as prepared in this Example, followed by a layer of calcium. The efficiency of the device at 100 Cd/meter$^2$ brightness is 1.3 Cd/Ampere. The half-life of the device is 50 hours at 100 Cd/meter$^2$. A maximum brightness of 2,170 Cd/meter$^2$ is obtained at 18 volts and at a current density of 400 mA/cm$^2$.

Comparative Example 1

Random Blue

Example 1 is repeated except that all the monomers are reacted at one time for 36 hours. The resulting random co-polymer has an inherent viscosity of 0.85 dL/g. The random co-polymer is used in a standardized polymer light emitting diode device prepared by depositing a layer of polyethylene dioxythiophene on an indium-tin oxide coated pane of glass, followed by a layer of the block polymer, followed by a layer of calcium. The efficiency of the device at 100 Cd/meter$^2$ brightness is 0.4 Cd/Ampere. The half-life of the device is less than one minute at 100 Cd/meter$^2$. A maximum brightness of 1190 Cd/meter$^2$ is obtained at 15 volts and at a current density of 400 mA/cm$^2$.

EXAMPLE 2

(Tri-Block Green)

To a stirred solution of 2,7-bis(1,3,2-dioxaborloan-2-yl)-9,9-dioctylfluorene (99.4%, 2.45 g, 4.59 mmol), 4,7-dibromo-2,1,3-benzothiadiazole (1.35 g, 4.59 mmol) in toluene (38 mL), under nitrogen is added Aliquat 336 (0.64 g), tetrakis(triphenylphosphine)palladium (6.0 mg, 5.2 micromol, 0.11 mol %) and aqueous sodium carbonate (2 M, 4.8 mL). The reaction is stirred and heated in an oil-bath at 95° C. for 16 hr. An orange, viscous solution of the emissive polymer block is obtained. The following formula is for the emitting block:

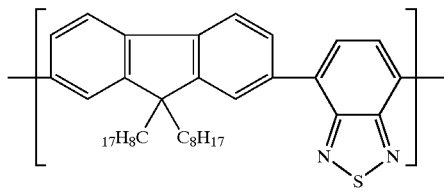

To the above solution was added 2,7-bis(1,3,2-dioxaborloan-2-yl)-9,9-dihexylfluorene (7.43 g, 15.57 mmol), 2,7-dibromo-9,9-dihexylfluorene (7.30 g, 14.83 mmol), 4,4'-dibromostilbene (0.25 g, 0.74 mmol), aqueous sodium carbonate (2 M, 32 mL), phase-transferring reagent Aliquat 336 (2.2 g), and tetrakis(triphenylphosphine) palladium (9.0 mg, 7.8 micromol), and toluene (100 mL). The reaction was allowed to go for 8 hr. The formula of the host block is given as following.

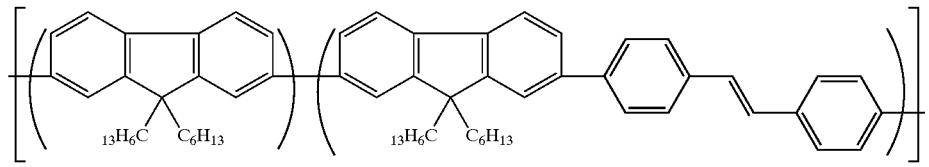

To above is added with 2,7-bis(1,3,2-dioxaborloan-2-yl)-9,9-dioctylfluorene (99.4%, 2.01 g, 3.77 mmol), N,N'-di(4-bromophenyl)-N,N'-di(3-ethoxcarbonylphenyl)-benzidine (99.4%, 2.62 g, 3.30 mmol), aqueous sodium carbonate (2 M, 8 mL), phase-transferring reagent Aliquat 336 (0.6 g), and tetrakis(triphenylphosphine) palladium (3 mg, 0.0026), and toluene (25 mL). The reaction is allowed to go for 14 hr to add the positive charge carrier block to the host block as given below.

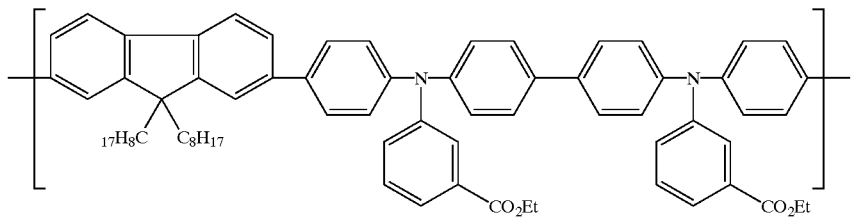

The tri-block polymer was end capped with 0.25 g of phenylboronic acid for 8 hours of refluxing and isolated as yellow fibers by precipitating from 4 L of methanol. Further purification and additional precipitation led to pure polymer, which weighed 11.4 g and had an inherent viscosity of 2.06 dL/g (THF, 25° C., 0.5 g/dL).

The above-described block polymer is used in a standardized polymer light emitting diode device prepared by depositing a layer of polyethylene dioxythiophene on an indium-tin oxide coated pane of glass, followed by a layer of the block polymer, followed by a layer of calcium. The efficiency of the device at 200 Cd/meter$^2$ brightness is 5.0 Cd/Ampere.

EXAMPLE 3

Tri-Block Green

To a 250 mL flask is charge with 2,7-bis(1,3,2-dioxaborloan-2-yl)-9,9-dioctylfluorene (99.4%, 2.45 g, 4.59 mmol), 4,7-dibromo-2,1,3-benzothiadiazole (1.35 g, 4.59 mmol), Aliquat 336 (0.6 g), tetrakis(triphenylphosphine) palladium (6.0 mg, 5.2 micromol), aqueous sodium carbonate (2 M, 4.6 mL) and toluene (40 mL). The reaction is stirred and heated in an oil-bath at 95° C. under nitrogen for 14 hours. A red-orange viscous solution was observed. The stirring is then stopped, and the solution of emissive block polymer is kept at 50° C. under nitrogen.

To a separated 250 mL flask is charged with 2,7-bis(1,3,2-dioxaborloan-2-yl)-9,9-dioctylfluorene (BF9914, 99.4%, 1.76 g, 3.30 mmol), N,N'-di(4-bromophenyl)-N,N'-di(3-Ethoxcarbonylphenyl)-benzidine (99.4%, 2.62 g, 3.30 mmol), Aliquat 336 (0.5 g), tetrakis(triphenylphosphine) palladium (4.3 mg, 3.7 micromol), aqueous sodium carbonate (2 M, 3.3 mL) in toluene (30 mL) and toluene (30 mL). The reaction is stirred and heated in an oil-bath under nitrogen at 95° C. for 14 hours. A light-brown viscous solution of positive charge carrier block polymer is observed. The stirring is then stopped, and the solution is kept at 50° C. under nitrogen.

To a 500 mL flask is charged with 2,7-bis(1,3,2-dioxaborloan-2-yl)-9,9-dioctylfluorene (99.4%, 7.11 g, 13.33 mmol), 2,7-dibromo-9,9-dioctylfluorene (7.31 g, 13.33 mmol), aqueous sodium carbonate (2 M, 33 mL), Aliquat 336 (2.2 g), and tetrakis(triphenylphosphine) palladium (9.5 mg, 8.2 micromol) and toluene (90 mL). The reaction is allowed to proceed for 14 hours. A light-brown viscous solution of host polymer block is observed.

To the host polymer block flask above emissive block polymer solution and positive charge carrier block polymer solutions are transferred, each with 15 mL of toluene and more 2,7-bis(1,3,2-dioxaborloan-2-yl)-9,9-dioctylfluorene (99.4%, 0.23 g, 0.42 mmol) and tetrakis (triphenylphosphine) palladium (1.0 mg) are added. The reaction is allowed to proceed for 16 hours. After which phenylboronic acid (0.2 g) and toluene (50 mL) are added and the stirring is continued for another 8 hours. At the end of the reaction a very viscous orange-colored solution of tri-block polymer is observed. The product was isolated as yellow fibers by precipitating from 4 L of methanol. Further purification and additional precipitation led to pure polymer, which weighed 12.0 g. The formula of the tri-block polymer is given as following.

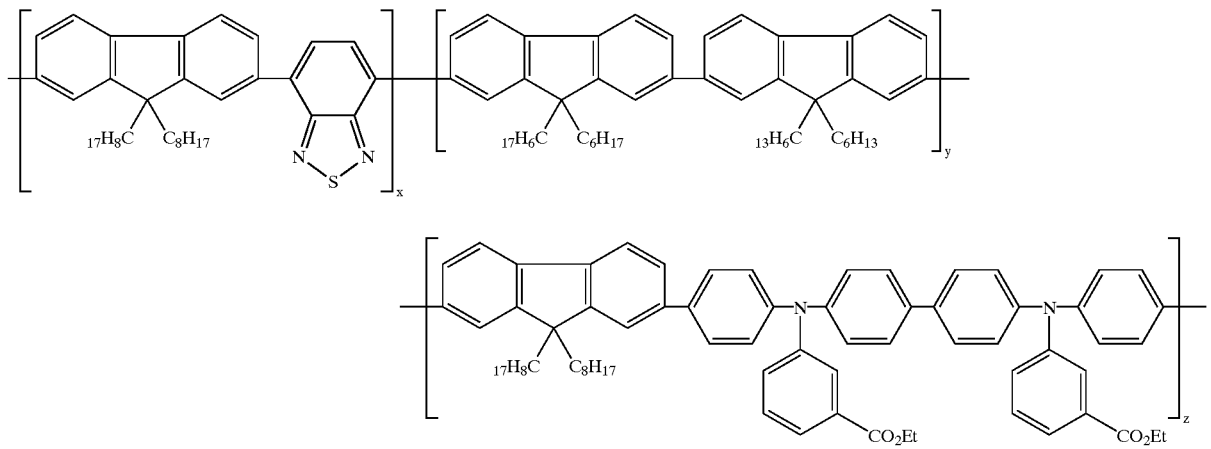

The above-described block polymer is used in a standardized polymer light emitting diode device prepared by depositing a layer of polyethylene dioxythiophene on an indium-tin oxide coated pane of glass, followed by a layer of the block polymer, followed by a layer of calcium. The efficiency of the device at 200 Cd/meter$^2$ brightness is 6.0 Cd/Ampere.

EXAMPLE 5

Di-Block Green

The experiment of Example 2 is repeated except that the host and positive charge carrier monomers are charged together at the same time. The resulting di-block polymer is used in a standardized polymer light emitting diode device prepared by depositing a layer of polyethylene dioxythiophene on an indium-tin oxide coated pane of glass, followed by a layer of the block polymer, followed by a layer of calcium. The efficiency of the device at 200 Cd/meter$^2$ brightness is 6.5 Cd/Ampere.

Comparative Example 2

Random Green

The experiment of Example 2 is repeated except that all of the monomers are charged together at the same time. The resulting random polymer is used in a standardized polymer light emitting diode device prepared by depositing a layer of polyethylene dioxythiophene on an indium-tin oxide coated pane of glass, followed by a layer of the block polymer, followed by a layer of calcium.

EXAMPLE 6

Random and block copolymer red emitters were prepared from the following monomers: 9,9 alkyl substituted fluorenes,

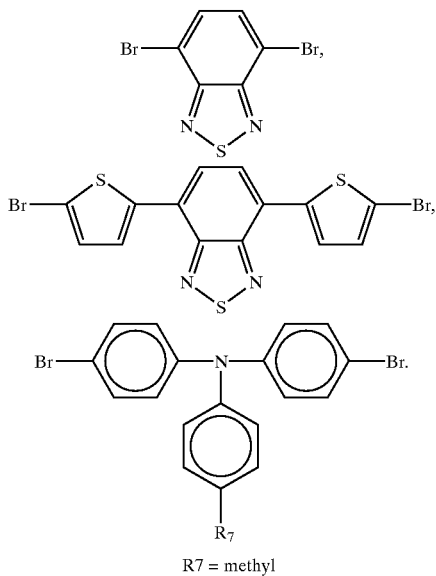

R7 = methyl

While devices made with these polymers displayed similar initial luminescence values, the block copolymer was easier to process and displayed significant lifetime benefits over the random copolymer.

What is claimed is:

1. An organic block polymer useful in an electroluminescent polymer device, comprising:
   (a) an emissive polymer block that is consistently conjugated along the backbone of the emissive polymer block; and at least one of the following:
   (b) a positive charge carrier polymer block that is consistently conjugated along the backbone of the positive charge carrier polymer block for transporting positive charge carriers to the emissive polymer block so that the positive charge carriers can combine with negative charge carriers to generate light
   (c) a negative charge carrier polymer block that is consistently conjugated along the backbone of the negative charge carrier polymer block for transporting negative charge carriers to the emissive polymer block so that the negative charge carriers can combine with positive charge carriers to generate light, and
   (d) a host polymer block that is consistently conjugated along the backbone of the host block for providing a matrix for emitter that affords Forster energy transfer and minimization of concentration quenching effects.

2. A process of making the block polymers of claim 1 by reacting the monomers under to build individual blocks separately and then combining and reacting the individual blocks to form a single component block polymer.

3. A process of making the block polymers of claim 1 by reaction of a first set of monomers to form the first block, followed by sequentially adding and reacting additional sets of monomers for each subsequent block to form a single component, block polymer.

4. The organic block polymer of claim 1, wherein at least one of the blocks comprises a substituted or unsubstituted fluorene group.

5. The organic block polymer of claim 4, wherein the polyfluorene group in at least one of the blocks is a 2,7-linked-9,9-dialkyl fluorene group.

6. The organic block polymer of claim 1, wherein the emissive polymer block comprises a first monomer group and a second monomer group and wherein each of the first monomer group and the second monomer group independently comprises a substituted or unsubstituted aromatic or heteroaromatic group.

7. The organic block polymer of claim 6, wherein the first monomer group is a fluorene group.

8. The organic block polymer of claim 6, wherein the second monomer group is naphthalene or anthracene or an aromatic or heteroaromatic diazine group fused to a benzene or thiophene group.

9. The organic block polymer of claim 7, wherein the second monomer group is naphthalene or anthracene or an aromatic or heteroaromatic diazine group fused to a beuzene or thiophene group.

10. The organic polymer of claim 9, wherein the second monomer group comprises a benzothiadiazole group.

11. The organic block polymer of claim 1, wherein a positive charge carrier polymer block is present which comprises a third monomer comprising a substituted or unsubstituted aromatic or heteroaromatic group.

12. The organic block polymer of claim 11, further comprising a fourth monomer wherein the third monomer comprises a polyfluorene group and the fourth monomer comprises a stilbene or 1,4-diene without electron-withdrawing substituents, tertiary amines, N,N,N',N'-tetraaryl-1,4-diaminobenzen; N,N,N',N'-tetraarylbenzidine, N-substituted-carbazoles, diarylsilanes, and thiophenes/furans/pyrroles without electron-withdrawing substituents.

13. The organic block polymer of claim 12, wherein the fourth monomer is substituted with a substituent selected from the group consisting of $C_{1-20}$ alkyls, $C_{6-20}$ aryls and alkylaryls optionally substituted with $C_{1-6}$ alkoxys and $C_{6-12}$ aryloxys.

14. The organic block polymer of claim 12, wherein the fourth monomer comprises a triarylamine group having the general formula —Ar$_3$N— wherein each Ar is the same or different and comprises a substituted or unsubstituted aromatic or heteroaromatic group.

15. The organic block polymer of claim 1, wherein a host polymer block is present which host polymer block comprises a fifth monomer comprising a substituted or unsubstituted aromatic or hetero aromatic group.

16. The organic block polymer of claim 11, wherein a host polymer block is present which host polymer block comprises a fifth monomer comprising a substituted or unsubstituted aromatic or heteroaromatic group.

17. The organic block polymer of claim 15, wherein the host polymer block also functions as a positive charge carrier block and the fifth monomer comprises a fluorene group, and the host polymer block further comprises a sixth monomer selected from a stilbene or 1,4-diene without electron-withdrawing substituents, tertiary amines, N,N,N', N'-tetraaryl-1,4-diaminobenzene, N,N,N',N'-tetraarylbenzidine, N-substituted-carbazoles, diarylsilanes, and thiophenes/furans/pyrroles without electron-withdrawing substituents.

18. The organic block polymer of claim 17, wherein the sixth monomer is substituted with a substituent selected from the group consisting of C$_{1-20}$ alkyls, C$_{6-20}$ aryls and alkylaryls optionally substituted with C$_{1-6}$ alkoxys and C$_{6-12}$ aryloxys.

19. The organic block polymer of claim 17, wherein the sixth monomer comprises a triarylamine group having the general formula —Ar$_3$N— wherein each AR is the same or different and comprises a substituted or unsubstituted aromatic or heteroaromatic group.

20. The organic block polymer of claim 15, comprising a sixth monomer group which is substituted with an electron withdrawing group thereby rendering the host block a negative charge carrier block.

21. The organic block polymer of claim 16, comprising a sixth monomer group which is substituted with an electron withdrawing group thereby rendering the host block a negative charge carrier block.

22. The organic block polymer of claim 20, wherein the fifth monomer is a polyfluorene group and the sixth monomer group comprises an electron withdrawing group.

23. The organic block polymer of claim 22, wherein the electron withdrawing group is selected from the group consisting of F, cyano, sulfonyl, carboxy; moieties containing an imine linkage, condensed polycyclic aromatics such as acenaphthene, phenanthrene, anthracene, fluoranthene, pyrene, perylene, rubrene, chrysene, and corene as well as five-membered heterocycles containing imine linkages include oxazoles/isoxazoles, N-substituted-imidazoles/ pyrazoles, thiazole/isothiazole, oxadiazoles, and N-substituted-triazoles and six-membered heterocycles containing imine linkages such as pyridines, pyridazines, pyrimidines, pyrazines, triazines, and tetrazenes as well as benzo-fused heterocycles containing imine linkages include benzoxazoles, benzothiazole, benzimidazoles, quinoline, isoquinolines, cinnolines, quinazolines, quinoxalines, phthalazines, benzothiadiazoles, benzotriazines, phenazines, phenanthridines, and, acridines.

24. The organic block polymer of claim 1 wherein the monomer groups of the emissive polymer block are essentially not comprised of a stilbene or 1,4-diene without electron-withdrawing substituents, tertiary amines, N,N,N', N'-tetraaryl-1,4-diaminobenzene, N,N,N',N'-tetraarylbenzidine, N-substituted-carbazoles, diarylsilanes, and thiophenes/furans/pyrroles without electron-withdrawing substituents.

25. The organic block polymer of claim 1, wherein the monomer groups of the emissive polymer block are essentially not comprised of a triarylamine group having the general formula —Ar$_3$N— wherein each Ar is the same or different and comprises a substituted or unsubstituted aromatic or heteroaromatic group.

26. An electroluminescent polymer device comprising an anode, a cathode and the electroluminescent polymer of claim 1 positioned between the anode and the cathode.

27. An organic block polymer comprising
an emissive block which comprises fluorene groups and benzothiadiazole groups and
a second block which comprises fluorene groups and triaryl amine groups.

28. The organic block polymer of claim 27 wherein the fluorene groups are 2,7-linked-9,9-dialkyl fluorenes and the benzothiadiazole is 2,7-linked 2,1,3-benzothiadiazole.

29. The organic block polymer of claim 27 wherein the fluorene groups and the benzothiadiazole groups form an alternating copolymer block.

30. The organic block polymer of claim 27 wherein the polymer emits in the green wavelength of light.

31. The organic block polymer of claim 27, wherein the fluorene groups are 2,7-linked-9,9-dialkyl fluorenes and the benzothiadiazole groups are 2,7-linked 2,1,3-benzothiadiazole and the monomer group left after reaction of the following

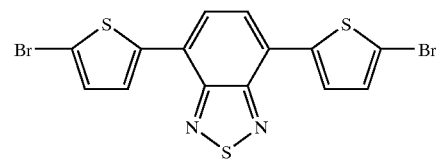

monomer compound.

32. The organic polymer of claim 31 wherein the fluorene groups and the triaryl amine containing monomer groups form an alternating copolymer.

33. The organic polymer of claim 32 wherein the polymer emits in the red wavelength of light.

* * * * *